(12) United States Patent
Miskiewicz et al.

(10) Patent No.: US 8,878,165 B2
(45) Date of Patent: Nov. 4, 2014

(54) ELECTRODE TREATMENT PROCESS FOR ORGANIC ELECTRONIC DEVICES

(75) Inventors: Pawel Miskiewicz, Cambridge, MA (US); Li Wei Tan, Eastleigh (GB); Tomas Backlund, Southampton (GB); Paul Craig Brookes, Southampton (GB); David Sparrowe, Bournemouth (GB); Toby Cull, Romsey (GB); Giles Lloyd, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 13/581,091

(22) PCT Filed: Jan. 26, 2011

(86) PCT No.: PCT/EP2011/000344
§ 371 (c)(1),
(2), (4) Date: Aug. 24, 2012

(87) PCT Pub. No.: WO2011/103952
PCT Pub. Date: Sep. 1, 2011

(65) Prior Publication Data
US 2012/0319097 A1  Dec. 20, 2012

(30) Foreign Application Priority Data

Feb. 25, 2010  (EP) .................................. 10001930
Aug. 23, 2010  (EP) .................................. 10008754

(51) Int. Cl.
*H01L 29/08*  (2006.01)
*H01L 51/00*  (2006.01)
*H01L 51/10*  (2006.01)
*H01L 51/05*  (2006.01)

(52) U.S. Cl.
CPC ........... *H01L 51/105* (2013.01); *H01L 51/0541* (2013.01); *H01L 51/0071* (2013.01); *H01L 51/0072* (2013.01); *H01L 51/0545* (2013.01); *Y02E 10/549* (2013.01)
USPC .......................................................... 257/40

(58) Field of Classification Search
CPC ............ H01L 51/0071; H01L 51/0072; H01L 51/105; Y02E 10/549
USPC ............... 428/624; 257/40, E51.025; 438/99; 252/500; 106/14.05
See application file for complete search history.

(56) References Cited

U.S. PATENT DOCUMENTS 6,869,637 B2  3/2005  Hutchinson et al.
7,482,207 B2  1/2009  Brown et al.

(Continued)

FOREIGN PATENT DOCUMENTS

DE  10 2005 005 589  8/2006
JP  2009 164368  7/2009

(Continued)

OTHER PUBLICATIONS

Alkharafi et al., "Comparative Effects of Tolytriazole and Benzotriazole Against Sulfide Attach on Copper" Sep. 30, 2009, Int. J. Electrochem. Sci, 4 (2009) pp. 1351-1364.*

(Continued)

*Primary Examiner* — Shaun Campbell
(74) *Attorney, Agent, or Firm* — Millen, White, Zelano & Branigan P.C.

(57) ABSTRACT

The present invention relates to a process for the treatment of electrodes in organic electronic (OE) devices, in particular organic field effect transistors (OFETs), to devices prepared by such a process, and to materials and formulations used in such a process.

15 Claims, 5 Drawing Sheets

(56) References Cited

U.S. PATENT DOCUMENTS

| | | |
|---|---|---|
| 7,935,565 B2 | 5/2011 | Brown et al. |
| 2003/0157264 A1 | 8/2003 | Hutchinson et al. |
| 2006/0081840 A1 | 4/2006 | Mori et al. |
| 2006/0148167 A1 | 7/2006 | Brown et al. |
| 2006/0160276 A1 | 7/2006 | Brown et al. |
| 2008/0012014 A1* | 1/2008 | Park et al. ............... 257/40 |
| 2008/0315191 A1 | 12/2008 | Hashizume et al. |
| 2009/0057656 A1 | 3/2009 | Matsubara et al. |
| 2009/0121192 A1 | 5/2009 | Abys et al. |
| 2010/0032657 A1* | 2/2010 | Yanai et al. ............... 257/40 |
| 2011/0207300 A1 | 8/2011 | Brown et al. |

FOREIGN PATENT DOCUMENTS

| | | |
|---|---|---|
| WO | WO-02 29132 | 4/2002 |
| WO | WO-2004 055920 | 7/2004 |

OTHER PUBLICATIONS

International Search Report for PCT/EP2011/000344 dated Mar. 21, 2011.

Fraunhofer Ges Forschung, "Hybrid organic thin layered field effect transistor for use in polymer circuit, has source and drain electrodes including thin copper layer whose surface area facing semiconductor layer is modified to form copper oxide layer between layers," Espacenet, Publication Date: Aug. 17, 2006; English Abstract of DE-10 2005 005 589.

Hitachi Ltd., "Organic thin film transistor, and manufacturing method thereof," Patent Abstracts of Japan, Publication Date: Jul. 23, 2009; English Abstract of JP-2009 164368.

* cited by examiner

ELECTRODE TREATMENT PROCESS FOR ORGANIC ELECTRONIC DEVICES

The present invention relates to a process for the treatment of electrodes in organic electronic (OE) devices, in particular organic field effect transistors (OFETs), to devices prepared by such a process, and to materials and formulations used in such a process.

BACKGROUND OF THE INVENTION

Organic field effect transistors (OFETs) are used in display devices and logic capable circuits. Different metals have been used as the source/drain electrodes in the organic field effect transistors. A widely used electrode material is gold (Au), however, its high cost and disadvantageous processing properties have shifted the focus to possible alternatives like for example Ag, Al, Cr, Ni, Cu, Pd, Pt, Ni or Ti. Copper (Cu) is one of the possible alternative electrode materials for Au, as it has a high conductivity, a relatively low price and is easier for the usual manufacturing processes. In addition, copper is already used in the semiconductor industry, therefore it is easier to switch the large scale production process of electronic devices to organic semiconductor materials as a new technology, when combined with the already established copper technology for the electrodes.

However, when using copper as the electrode, i.e. as charge carrier injection metal, there is a disadvantage due to its low work function, which is below the level of most modern organic semiconductors.

DE 10 2005 005 089 A1 describes an OFET comprising copper source and drain electrodes which are surface modified by providing a copper oxide layer thereon. However, since the copper in an ambient atmosphere tends to oxidize to $Cu_2O$ and then to CuO and further to Cu hydroxides, this can create a non-metal conductive layer on the Cu electrode which results in limited charge carrier injection into the semiconductor layer.

In prior art there are known methods of metal or metal oxide electrode modification in order to improve charge carrier injection, which are based e.g. on thiol compounds.

For example, US 2008/0315191 A1 discloses an organic TFT comprising source and drain electrodes formed of a metal oxide, wherein the electrode surfaces are subjected to surface treatment by applying a thin film, with a thickness of 0.3 to 1 molecular layer, of a thiol compound, for example pentafluorobenzenethiol, perfluoroalkylthiol, trifluoromethanethiol, pentafluoroenthanethiol, heptafluoropropanethiol, nonafluorobutanethiol, sodium butanethiol, sodium butanoate thiol, sodium butanol thiol or aminothiophenol. However this approach is effective mainly for gold electrodes, but not for copper electrodes because, compared to a gold surface, on a copper surface the thiol groups form weaker chemical bonds.

It is therefore an aim of the present invention to provide improved methods for modifying metal or metal oxide electrodes or charge injection layers, including but not limited to copper electrodes, in organic electronic devices, in order to overcome the drawbacks of metal electrodes known from prior art, like low work function and low oxidative stability. Another aim is to provide improved electrodes and charge injection layers based on metal or metal oxides for use in organic electronic devices, in particular OFETs and OLEDs, and methods for their preparation. Another aim is to provide improved organic electronic devices, in particular OFETs and OLEDs, and methods for their preparation, containing a modified metal or metal oxide electrode according to the present invention. The methods, electrodes and devices should not have the drawbacks of prior art methods and allow time-, cost- and material-effective production of electronic devices at large scale. Other aims of the present invention are immediately evident to the expert from the following detailed description.

It was found that these aims can be achieved by providing processes for electrode treatment, materials used in such processes, electrodes treated by such processes, and devices containing such treated electrodes as described in the present invention. In particular, the present invention is related to a chemistry-based treatment process for metal electrodes which improves their work function and their properties of charge carrier injection into an organic semiconductor. This is achieved by providing a process for subjecting the electrode surface to a self-assembled monolayer (SAM) treatment process with a chemical class of compounds known as benzotriazoles (BTA), or derivatives or structural analogues of these compounds, which are optionally substituted with electron withdrawing groups, like e.g. F or CN, and/or surface active groups, like e.g. thiol or perfluoroalkyl groups. It was found that this is a very efficient method of electrode modification, especially when applied to copper electrodes, even in the presence of copper oxides, which improves the work function of the electrode and thereby improves its charge carrier injection into semiconductor layer. The surface treatment process according to the present invention enables the manufacture of electronic devices, in particular of OFETs, with improved source/drain electrodes.

Benzotriazoles are known in prior art as pharmaceutical compounds, and have also been proposed for use as passivation materials in the inorganic semiconductor industry, mainly for protection in chemical-mechanical polishing processes, as described for example in "Review on copper chemical-mechanical polishing (CMP) and post-CMP cleaning in ultra large system integrated (ULSI)—An electrochemical perspective", E-E. Yair and Starosvetsky D., Electrochimica Acta, 52, 2007, 1825. However, they have hitherto not been suggested for SAM treatment to improve the work function of metal electrodes in organic electronic devices.

US 2009/0121192 A1 discloses a method for enhancing the corrosion resistance of an article comprising an Ag coating which is deposited on a solderable Cu substrate. This is achieved by exposing the Ag coating to an anti-corrosion composition comprising a multifunctional molecule, wherein said multifunctional molecule comprises at least one nitrogen-containing organic functional group that interacts with and protects Cu surfaces, and further comprises at least one sulphur-containing organic functional group that interacts with and protects Ag surfaces. However, whereas the method has the aim to enhance of the corrosion resistance of the Ag coating, there is no hint or suggestion to a method for changing the properties of the metal with the aim to improve its charge carrier injection when used as electrode in an organic electronic device.

SUMMARY OF THE INVENTION

The invention relates to a process comprising the steps of providing in an electronic device one more electrodes containing a metal or metal oxide, and
depositing onto the surface of said electrodes a layer comprising a compound of formula I as defined below, and
depositing onto the surface of said electrodes which is covered by said layer comprising the compound of formula I, or depositing in the area between two or more of said electrodes, an organic semiconductor,

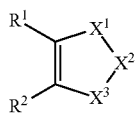

wherein
$X^1$, $X^2$, $X^3$ are independently of each other selected from —N(H)—, —N=, =N—, —C($R^x$)=, =C($R^x$)— and —S—, wherein at least one of $X^1$, $X^2$ and $X^3$ is different from —C($R^x$)= and =C($R^x$)—, $R^x$ is on each occurrence identically or differently H, SH, $NH_2$, or straight-chain or branched alkyl with 1 to 15 C atoms, in which one or more non-adjacent C atoms are optionally replaced by —O—, —S—, —$NR^0$—, —CO—, —CO—O—, —O—CO—, O—CO—O—, —$CR^0$=$CR^{00}$— or —C≡C— and in which one or more H atoms are optionally replaced by F, Cl, Br, I or CN, $R^1$ and $R^2$ are independently of each other F, Cl, P-Sp-, or straight-chain or branched alkyl with 1 to 15 C atoms, in which one or more non-adjacent C atoms are optionally replaced by —O—, —S—, —$NR^0$—, —CO—, —CO—O—, —O—CO—, —O—CO—O—, —$CR^0$=$CR^{00}$— or —C≡C— and in which one or more H atoms are optionally replaced by F, Cl, Br, I or CN, or denote aryl, heteroaryl, aryloxy, heteroaryloxy, arylcarbonyl, heteroarylcarbonyl, arylcarbonyloxy, heteroarylcarbonyloxy, aryloxycarbonyl or heteroaryloxycarbonyl having 2 to 30 C atoms that is unsubstituted or substituted by one or more non-aromatic groups R, or $R^1$ and $R^2$, together with each other and with the 5-membered heterocycle to which they are attached, form an aromatic or heteroaromatic ring that comprises 5 to 7 ring atoms and is unsubstituted or substituted by 1, 2, 3, 4 or 5 groups R, $R^0$ and $R^{00}$ are independently of each other H or optionally substituted carbyl or hydrocarbyl optionally comprising one or more hetero atoms, R is on each occurrence identically or differently H, P-Sp-, halogen, —CN, —NC, —NCO, —NCS, —OCN, —SCN, —C(=O)$NR^0R^{00}$, —C(=O)$X^0$, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, carbyl or hydrocarbyl with 1 to 40 C atoms that is optionally substituted and optionally comprises one or more hetero atoms, P is a polymerisable or crosslinkable group,
Sp is a spacer group or a single bond,
$X^0$ is halogen.

The invention further relates to an electrode, electrode layer or charge injection layer, preferably source and/or drain electrodes, in an electronic device, preferably in an organic electronic (OE) device, very preferably in a top gate or bottom gate organic field effect transistor (OFET), which is obtainable or obtained by a process as described above and below.

The invention further relates to an electronic device, preferably an OE device, very preferably a top gate or bottom gate OFET, comprising an electrode, electrode layer or charge injection layer as described above and below, very preferably as source and/or drain electrode, and to a process for manufacturing such a device.

Preferably the electronic device is selected from the group consisting of organic field effect transistors (OFET), organic thin film transistors (OTFT), organic complementary thin film transistors (CTFT), components of integrated circuitry (IC), radio frequency identification (RFID) tags, organic light emitting diodes (OLED), electroluminescent displays, flat panel displays, backlights, photodetectors, sensors, logic circuits, memory elements, capacitors, organic photovoltaic (OPV) cells, charge injection layers, Schottky diodes, planarising layers, antistatic films, conducting substrates or patterns, photoconductors, photoreceptors, electrophotographic devices and xerographic devices.

The invention further relates to novel compounds of formula I. The invention further relates to novel formulations comprising one or more compounds of formula I and optionally one or more solvents. The invention further relates to the use of the novel compounds and formulations in the processes as described above and below, and to OE devices comprising the novel compounds or formulations.

DETAILED DESCRIPTION OF THE INVENTION

Figure 1:
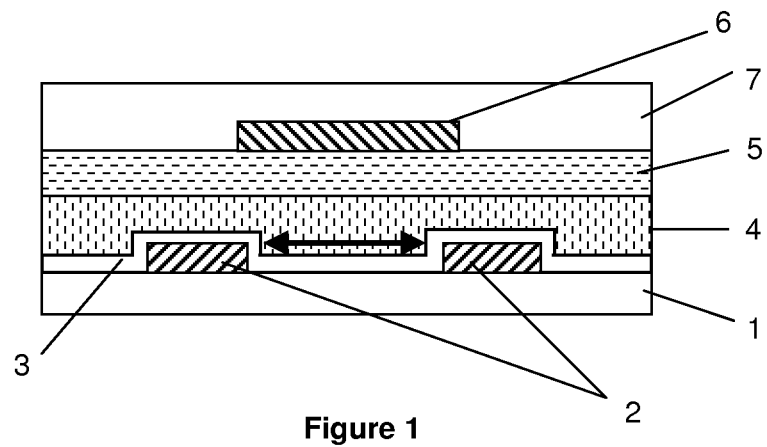
FIG. 1 schematically depicts a typical top gate OFET according to the present invention.

In the foregoing and the following, the terms "electrode", "electrode layer" and "charge injection layer" are used interchangeably. Thus reference to an electrode or electrode layer also includes reference to a charge injection layer and vice versa.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more hetero atoms, preferably selected from N, O, S, P, Si, Se, As, Te and Ge.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be straight-chain or branched. The $C_1$-$C_{40}$ carbyl or hydrocarbyl group includes for example: a $C_1$-$C_{40}$ alkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ alkyl group, a $C_4$-$C_{40}$ alkyldienyl group, a $C_4$-$C_{40}$ polyenyl group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ alkyl group, a $C_4$-$C_{20}$ alkyldienyl group, a $C_6$-$C_{12}$ aryl group and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

"Aryl" and "heteroaryl", either if used alone or in terms like "arylcarbonyl" or "heteroarylcarbonyl" etc., preferably denote a mono-, bi- or tricyclic aromatic or heteroaromatic group with up to 25 C atoms that may also comprise condensed rings and is optionally substituted with one or more groups L as defined above.

Very preferred substituents L are selected from halogen, most preferably F, or alkyl, alkoxy, oxaalkyl, thioalkyl, fluoroalkyl and fluoroalkoxy with 1 to 12 C atoms or alkenyl, alkynyl with 2 to 12 C atoms.

Especially preferred aryl and heteroaryl groups are phenyl in which, in addition, one or more CH groups may be replaced by N, naphthalene, thiophene, selenophene, thienothiophene, dithienothiophene, fluorene and oxazole, all of which can be unsubstituted, mono- or polysubstituted with L as defined above. Very preferred rings are selected from pyrrole, preferably N-pyrrole, pyridine, preferably 2- or 3-pyridine, pyrimidine, thiophene preferably 2-thiophene, selenophene, preferably 2-selenophene, thieno[3,2-b]thiophene, thiazole, thiadiazole, oxazole and oxadiazole, especially preferably thiophene-2-yl, 5-substituted thiophene-2-yl or pyridine-3-yl, all of which can be unsubstituted, mono- or polysubstituted with L as defined above.

An alkyl or alkoxy radical, i.e. where the terminal $CH_2$ group is replaced by —O—, can be straight-chain or branched. It is preferably straight-chain, has 2, 3, 4, 5, 6, 7 or 8 carbon atoms and accordingly is preferably ethyl, propyl, butyl, pentyl, hexyl, heptyl, octyl, ethoxy, propoxy, butoxy, pentoxy, hexoxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

An alkenyl group, wherein one or more $CH_2$ groups are replaced by —CH=CH— can be straight-chain or branched. It is preferably straight-chain, has 2 to 10 C atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example. Oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one $CH_2$ group is replaced by —O— and one by —CO—, these radicals are preferably neighboured. Accordingly these radicals together form a carbonyloxy group —CO—O— or an oxycarbonyl group —O—CO—. Preferably this group is straight-chain and has 2 to 6 C atoms. It is accordingly preferably acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxy-ethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxy-carbonylmethyl, propoxycarbonylmethyl, butoxycarbonylmethyl, 2-(methoxycarbonyl)ethyl, 2-(ethoxycarbonyl)ethyl, 2-(propoxy-carbonyl)ethyl, 3-(methoxycarbonyl)propyl, 3-(ethoxycarbonyl)propyl, 4-(methoxycarbonyl)-butyl.

An alkyl group wherein two or more $CH_2$ groups are replaced by —O— and/or —COO— can be straight-chain or branched. It is preferably straight-chain and has 3 to 12 C atoms. Accordingly it is preferably bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl, 5,5-bis-(ethoxycarbonyl)-hexyl.

A thioalkyl group, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

A fluoroalkyl group is preferably straight-chain perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$.

The above-mentioned alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, in particular 2-methylbutyl, 2-methylbutoxy, 2-methylpentoxy, 3-methylpentoxy, 2-ethyl-hexoxy, 1-methylhexoxy, 2-octyloxy, 2-oxa-3-methylbutyl, 3-oxa-4-methylpentyl, 4-methylhexyl, 2-hexyl, 2-octyl, 2-nonyl, 2-decyl, 2-dodecyl, 6-meth-oxyoctoxy, 6-methyloctoxy, 6-methyloctanoyloxy, 5-methyl heptyloxycarbonyl, 2-methylbutyryloxy, 3-methylvaleroyloxy, 4-methylhexanoyloxy, 2-chloropropionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxahexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Very preferred are 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy and 3-methylbutoxy.

—$CY^1$=$CY^2$— is preferably —CH=CH—, —CF=CF— or —CH=C(CN)—.

Halogen is F, Cl, Br or I, preferably F, Cl or Br.

The polymerisable or crosslinkable group P in formula I* and its subformulae is a group that is capable of participating in a polymerisation reaction, like radical or ionic chain polymerisation, polyaddition or polycondensation, or capable of being grafted, for example by condensation or addition, to a polymer backbone in a polymer analogous reaction. Especially preferred are polymerisable groups for chain polymerisation reactions, like radical, cationic or anionic polymerisation. Very preferred are polymerisable groups comprising a C—C double or triple bond, and polymerisable groups capable of polymerisation by a ring-opening reaction, like oxetanes or epoxides.

Preferably the polymerisable or crosslinkable group P is selected from $CH_2$=$CW^1$—CO—O—, $CH_2$=$CW^1$—CO—,

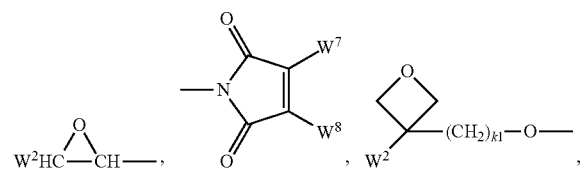

$CH_2$=$CW^2$—(O)$_{k1}$—, $CW^1$=CH—CO—(O)$_{k3}$—, $CW^1$=CH—CO—NH—, $CH_2$=$CW^1$—CO—NH—, $CH_3$—CH=CH—O—, ($CH_2$=CH)$_2$CH—OCO—, ($CH_2$=CH—$CH_2$)$_2$CH—O—CO—, ($CH_2$=CH)$_2$CH—O—, ($CH_2$=CH—$CH_2$)$_2$N—, ($CH_2$=CH—$CH_2$)$_2$N—CO—, HO—$CW^2W^3$—, HS—$CW^2W^3$—, H$W^2$N—, HO—$CW^2W^3$—NH—, $CH_2$=CH—(CO—O)$_{k1}$-Phe-(O)$_{k2}$—, $CH_2$=CH—(CO)$_{k1}$-Phe-(O)$_{k2}$—, Phe-CH=CH—, HOOC—, OCN—, and $W^4W^5W^6$Si—, with $W^1$ being H, F, Cl, CN, $CF_3$, phenyl or alkyl with 1 to 5 C-atoms, in particular H, Cl or $CH_3$, $W^2$ and $W^3$ being independently of each other H or alkyl with 1 to 5 C-atoms, in particular H, methyl, ethyl or n-propyl, $W^4$, $W^5$ and $W^6$ being independently of each other Cl, oxaalkyl or oxacarbonylalkyl with 1 to 5 C-atoms, $W^7$ and $W^8$ being independently of each other H, Cl or alkyl with 1 to 5 C-atoms, Phe being 1,4-phenylene that is optionally substituted by one or more groups L as defined above, $k_1$, $k_2$ and $k_3$ being independently of each other 0 or 1, $k_3$ preferably being 1, and $k_4$ being an integer from 1 to 10.

Especially preferred groups P are $CH_2$=CH—CO—O—, $CH_2$=C($CH_3$)—CO—O—, $CH_2$=CF—CO—O—, $CH_2$=CH—O—, ($CH_2$=CH)$_2$CH—O—CO—, ($CH_2$=CH)$_2$CH—O—,

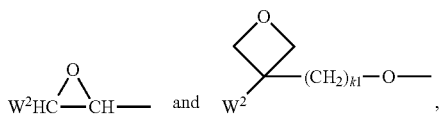

or protected derivatives thereof. Further preferred groups P are selected from the group consisting of vinyloxy, acrylate, methacrylate, fluoroacrylate, chloracrylate, oxetan and epoxy groups, very preferably from epoxy, oxetane, acrylate and methacrylate groups.

Polymerisation of group P can be carried out according to methods that are known to the ordinary expert and described in the literature, for example in D. J. Broer; G. Challa; G. N. Mol, *Macromol. Chem.*, 1991, 192, 59.

The term "spacer group" is known in prior art and suitable spacer groups Sp are known to the ordinary expert (see e.g. Pure Appl. Chem. 73(5), 888 (2001). The spacer group Sp is preferably of formula Sp'-X', such that P-Sp- is P-Sp'-X'—, wherein Sp' is alkylene with up to 30 C atoms which is unsubstituted or mono- or polysubstituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, X' is —O—, —S—, —CO—, —COO—, —OCO—, —O—COO—, —CO—$NR^0$—, —$NR^0$—CO—, —$NR^0$—CO—$NR^{00}$—, —$OCH_2$—, —$CH_2$O—, —$SCH_2$—, —$CH_2$S—, —$CF_2$O—, —$OCF_2$—, —$CF_2$S—, —$SCF_2$—, —$CF_2CH_2$—, —$CH_2CF_2$—, —$CF_2CF_2$—, —CH=N—, —N=CH—, —N=N—, —CH=$CR^0$—, —$CY^1$=$CY^2$—, —C≡C—, —CH=CH—COO—, —OCO—CH=CH— or a single bond, $R^0$ and $R^{00}$ are independently of each other H or alkyl with 1 to 12 C-atoms, and $Y^1$ and $Y^2$ are independently of each other H, F, Cl or CN.

X' is preferably —O—, —S—, —$OCH_2$—, —$CH_2$O—, —$SCH_2$—, —$CH_2$S—, —$CF_2$O—, —$OCF_2$—, —$CF_2$S—, —$SCF_2$—, —$CH_2CH_2$—, —$CF_2CH_2$—, —$CH_2CF_2$—, —$CF_2CF_2$—, —CH=N—, —N=CH—, —N=N—, —CH=$CR^0$—, —$CY^1$=$CY^2$—, —C≡C— or a single bond, in particular —O—, —S—, —C≡C—, —$CY^1$=$CY^2$— or a single bond. In another preferred embodiment X' is a group that is able to form a conjugated system, such as —C≡C— or —$CY^1$=$CY^2$—, or a single bond.

Typical groups Sp' are, for example, —($CH_2$)$_p$—, —($CH_2CH_2$O)$_q$—$CH_2CH_2$—, —$CH_2CH_2$—S—$CH_2CH_2$— or —$CH_2CH_2$—NH—$CH_2CH_2$— or —($SiR^0R^{00}$—O)$_p$—, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

Preferably in the compounds of formula I $R^1$ and $R^2$, together with each other and with the 5-membered heterocycle to which they are attached, form an aromatic or heteroaromatic ring that comprises 5 to 7 ring atoms and is unsubstituted or substituted by 1, 2, 3, 4 or 5 groups R. Very preferably $R^1$ and $R^2$, together with each other and with the 5-membered heterocycle to which they are attached, form a benzene ring wherein one or two CH groups are optionally replaced by N, most preferably a benzene, pyridine or pyrimidine ring, and wherein said ring is unsubstituted or substituted by 1, 2, 3 or 4 groups R, which are very preferably selected from non-aromatic groups.

The compounds of formula I are preferably selected of formula I1

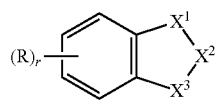

I1 wherein
X¹ is —N(H)—, —C(R$^x$)═, or —S—,
X² is —N═, —N(H)—, —C(R$^x$)═ or —S—,
X³ is —N═ or —N(H)—,
r is 0, 1, 2, 3 or 4,
and R$^x$, and R have the meanings given in formula I above.

Preferred compounds of formula I1 are selected from the group consisting of the following subformulae:

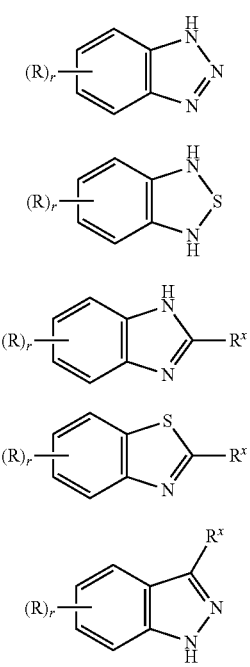

I11

I12

I13

I14

I15 wherein R$^x$, R and r are as defined in formula I1. R$^x$ is preferably H, SH, NH$_2$, -alkylene-SH, wherein alkylene denotes a straight-chain or branched alkylene group with 1 to 18 C atoms, or C$_1$-C$_{18}$ thiaalkyl. R preferably denotes, on each occurrence identically or differently, F or C$_1$-C$_{15}$ perfluoroalkyl, very preferably F or perfluoroalkyl with 1, 2, 3 or 4 C atoms.

Further preferred are compounds of formula I and I1 and their preferred subformulae I11-I15 containing at least one group R and/or R$^x$ that denotes P-Sp, wherein Sp is a spacer group as defined above or a single bond, and P is a polymerisable or crosslinkable group as defined above.

Preferred compounds of formula I11 are selected from the group consisting of the following subformulae:

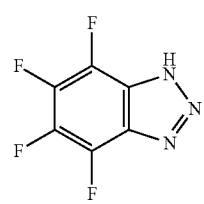

I11a

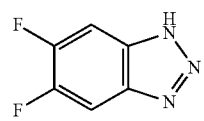

I11b

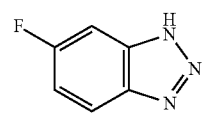

I11c

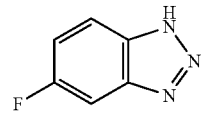

I11d

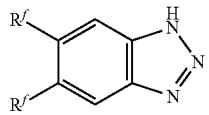

I11e

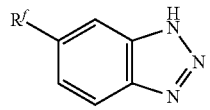

I11f

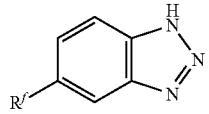

I11g wherein R$^f$ is straight chain or branched perfluoroalkyl having 1 to 15 C atoms, which is preferably straight chain and/or preferably has 1, 2, 3 or 4 C atoms. Especially preferred are compounds of formula I11e, I11f and I11g wherein R$^f$ is CF$_3$, C$_2$F$_5$, n-C$_3$F$_7$ or n-C$_4$F$_9$.

Preferred compounds of formula I12 are selected from the group consisting of the following subformulae:

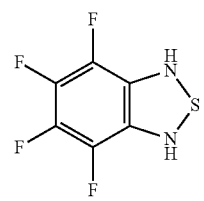

I12a

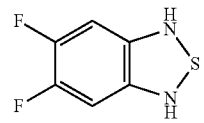

I12b

I12c 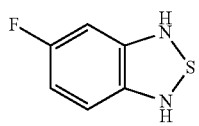

I12d 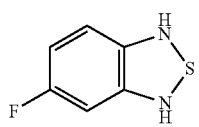

I12e 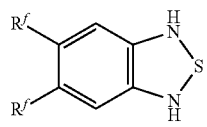

I12f 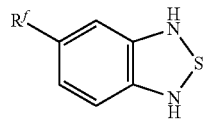

I12g 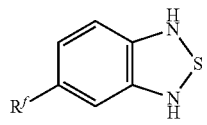

wherein $R^f$ is straight chain or branched perfluoroalkyl having 1 to 15 C atoms, which is preferably straight chain and/or preferably has 1, 2, 3 or 4 C atoms. Especially preferred are compounds of formula I12e, I12f and I12g wherein $R^f$ is $CF_3$, $C_2F_5$, n-$C_3F_7$ or n-$C_4F_9$.

Preferred compounds of formula I13 are those wherein $R^x$ is H, very preferably selected from the group consisting of the following subformulae:

I13a 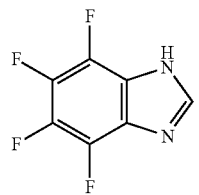

I13b 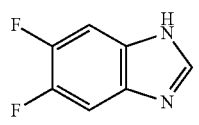

I13c 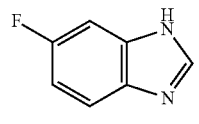

I13d 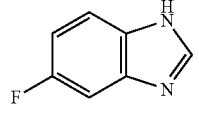

I13e 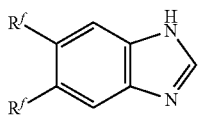

I13f 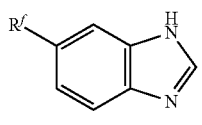

I13g 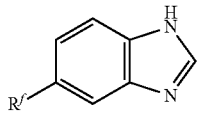

wherein $R^f$ is straight chain or branched perfluoroalkyl having 1 to 15 C atoms, which is preferably straight chain and/or preferably has 1, 2, 3 or 4 C atoms. Especially preferred are compounds of formula I13e, I13f and I13g wherein $R^f$ is $CF_3$, $C_2F_5$, n-$C_3F_7$ or n-$C_4F_9$.

Further preferred compounds of formula I13 are those wherein $R^x$ is SH, very preferably selected from the group consisting of the following subformulae:

I13h 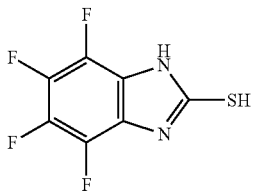

I13i 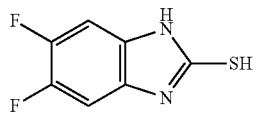

I13k 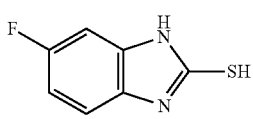

I13m 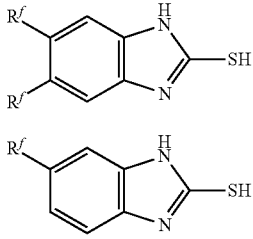

I13n 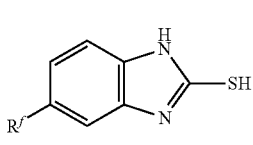

I13o 

I13p 

wherein $R^f$ is straight chain or branched perfluoroalkyl having 1 to 15 C atoms, which is preferably straight chain and/or preferably has 1, 2, 3 or 4 C atoms. Especially preferred are compounds of formula I13n, I13o and I14p wherein $R^f$ is $CF_3$, $C_2F_5$, n-$C_3F_7$ or n-$C_4F_9$.

Further preferred compounds of formula I13 are those wherein $R^x$ is alkylene-SH, wherein "alkyene" denotes a straight-chain or branched alkylene group with 1 to 18 C atoms, very preferably 1 to 12 C atoms. These compounds are very preferably selected from the group consisting of the following subformulae

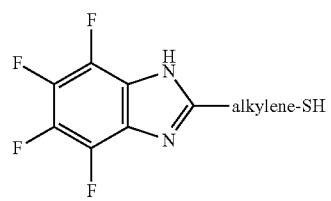

I13q

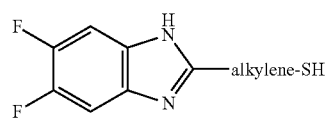

I13r

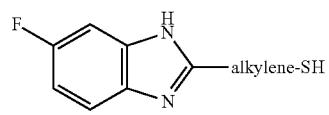

I13s

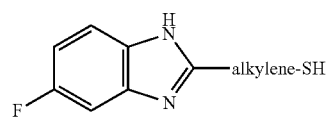

I13t

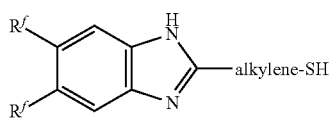

I13u

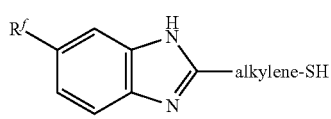

I13v

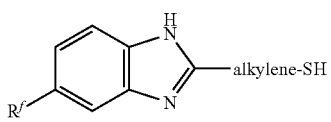

I13w wherein $R^f$ is straight chain or branched perfluoroalkyl having 1 to 15 C atoms, which is preferably straight chain and/or preferably has 1, 2, 3 or 4 C atoms. Especially preferred are compounds of formula I13u, I13v and I13w wherein $R^f$ is $CF_3$, $C_2F_5$, n-$C_3F_7$ or n-$C_4F_9$.

Preferred compounds of formula I14 are those wherein $R^x$ is SH, very preferably selected from the group consisting of the following subformulae:

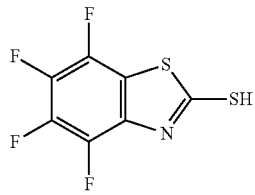

I14a

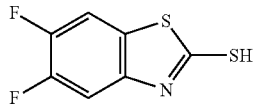

I14b

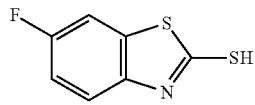

I14c

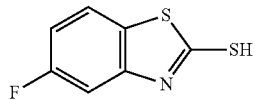

I14d

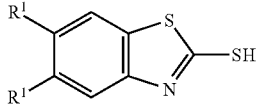

I14e

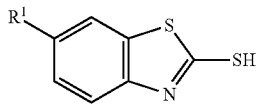

I14f

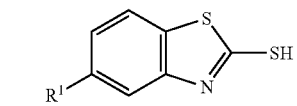

I14g wherein $R^f$ is straight chain or branched perfluoroalkyl having 1 to 15 C atoms, which is preferably straight chain and/or preferably has 1, 2, 3 or 4 C atoms. Especially preferred are compounds of formula I14e, I14f and I14g wherein $R^f$ is $CF_3$, $C_2F_5$, n-$C_3F_7$ or n-$C_4F_9$.

Further preferred compounds of formula I14 are those wherein $R^x$ is alkylene-SH, wherein "alkyene" denotes a straight-chain or branched alkylene group with 1 to 18 C atoms, very preferably 1 to 12 C atoms. These compounds are very preferably selected from the group consisting of the following subformulae

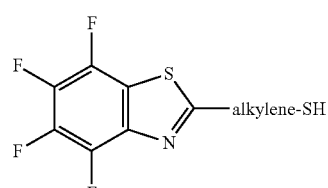

I14h

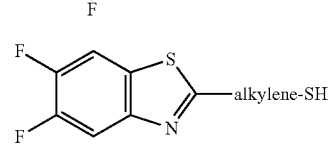

I14i

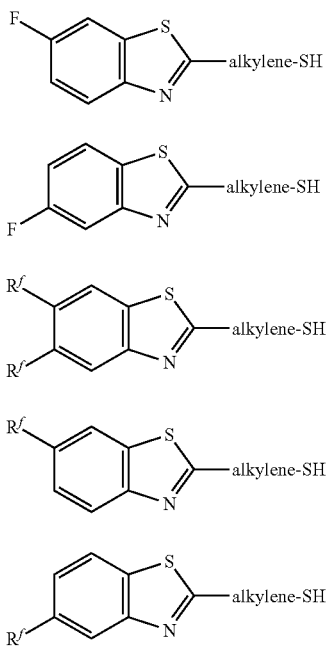

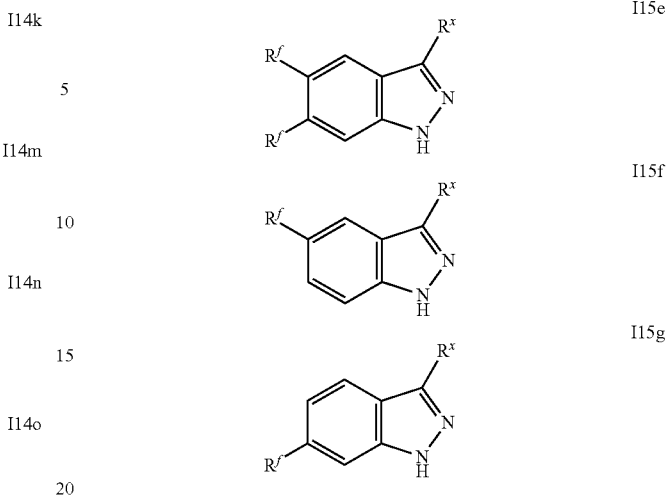

wherein $R^f$ is straight chain or branched perfluoroalkyl having 1 to 15 C atoms, which is preferably straight chain and/or preferably has 1, 2, 3 or 4 C atoms. Especially preferred are compounds of formula I14n, I14o and I14p wherein $R^f$ is $CF_3$, $C_2F_5$, n-$C_3F_7$ or n-$C_4F_9$.

Preferred compounds of formula I15 are selected from the group consisting of the following subformulae:

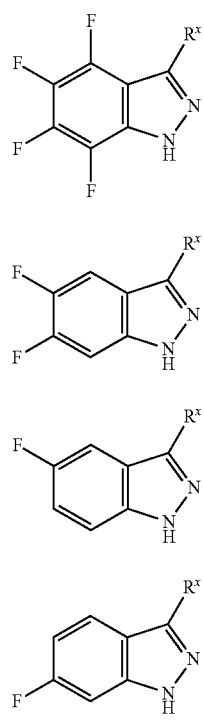

wherein $R^f$ is straight chain or branched perfluoroalkyl having 1 to 15 C atoms, which is preferably straight chain and/or preferably has 1, 2, 3 or 4 C atoms, and $R^x$ is as defined in formula I1, and very preferably is H, SH or $NH_2$. Especially preferred are compounds of formula I15e, I15f and I15g wherein $R^f$ is $CF_3$, $C_2F_5$, n-$C_3F_7$ or n-$C_4F_9$. Further preferred are compounds of formula I15a-I15g wherein $R^x$ is $NH_2$.

The compounds of formula I and their subformulae are commercially available, for example from ACES Pharma (US), or can be synthesized by conventional synthesis methods that are known to the skilled person and have been described in the literature.

Another aspect of the present invention are novel compounds of formula I, preferably selected from the above-mentioned preferred subformulae and preferred embodiments.

Further aspects of the invention are the use of the novel compounds and formulations in the processes as described above and below, and OE devices comprising the novel compounds or formulations.

In the process according to the present invention, the compounds of formula I preferably form a self-assembled monolayer (SAM) on the electrode surface, which is preferably capable of providing chemical bonds or electrostatic interactions with the electrode surface, preferably via the 5-membered heterocycle and/or the group $R^x$, and wherein the groups $R^1$ and/or $R^2$, or the ring formed by these groups, are facing the OSC layer.

In addition, the layer formed by the compounds of formula I has improved surface properties, including but not limited to charge injection and transport, on the surface facing the OSC layer. This is achieved by selecting suitable substituents $R^1$ and/or $R^2$ or suitable substituents R on the benzene ring in the compounds of formula I, these substituents being preferably selected from halogen, in particular F or Cl, or polyfluorinated or perfluorinated carbyl or hydrocarbyl, in particular perfluoroalkyl or perfluoroalkoxy.

Thereby, the use of an SAM of the compound of formula I can decrease the contact resistance between the electrode surface and the OSC layer and improve charge carrier injection into the OSC layer.

The SAM of the compound of formula I can be applied by vacuum or vapour deposition methods like physical vapour deposition (PVS) or chemical vapour deposition (CVD) or sublimation, or by liquid coating methods. Preferably solvent-based liquid coating methods are used.

The SAM of the compound of formula I is preferably applied by depositing a formulation, preferably a solution, comprising one or more compounds of formula I and further comprising one or more organic solvents onto the electrode, followed by evaporation of the solvent(s). Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating, or pad printing.

The step of applying an SAM of the compound of formula I to the electrode is hereinafter also referred to as "SAM treatment".

Suitable solvents are selected from solvents including but not limited to alcohols such as methanol, ethanol, isopropanol, organic ketones such as acetone, 2-heptanone, cyclohexanone, linear and cyclic ethers such as THF, butyl-phenyl ether, 4-methylanisole, aromatic hydrocarbons such as toluene, mesitylene, cyclohexylbenzene and halogenated hydrocarbons such as mono- or di-, or tri-chlorobenzene and mixtures thereof.

The concentration of the compounds of formula I in the formulation or solution is preferably from 0.01 to 10 wt. %, preferably from 0.01 to 5 wt. %, very preferably 0.05 to 0.2 wt. %.

Another aspect of the invention is a formulation comprising one or more compounds of formula I and one or more solvents, preferably selected from the solvents described above.

The electrodes can be applied by solvent-based or liquid coating methods, such as spray-, dip-, web- or spin-coating, or by vacuum or vapour deposition methods like physical vapour deposition (PVS) or chemical vapour deposition (CVD) or sublimation. Suitable deposition methods are known to the skilled person and described in the literature.

Suitable and preferred electrode materials include particles of metal such as Au, Ag, Cu, Al, Ni, and their oxides, mixtures of these metals and/or their oxides, sputter coated or evaporated metals such as Cu, Cr, Pt/Pd or mixed metal oxides such as indium tin oxide (ITO). Preferably the electrodes comprise or consist of metals and/or their oxides wherein the metals are selected from the group consisting of Au, Ag, Cu, Al and Ni, very preferably selected from Au, Ag and Cu, most preferably Cu.

Preferably, the electrodes are subjected to a preliminary washing step before the SAM treatment. The washing step preferably includes an acidic washing with organic or inorganic acids like for example acetic acid, citric acid or HCl.

In a preferred embodiment of the present invention, the washing and the SAM treatment of the electrode are combined into a single step. For example, this single step is carried out by applying a compound of formula I that is dissolved in an organic or inorganic acids like for example acetic acid, citric acid or HCl, onto the electrode.

Another aspect of the invention is a formulation comprising one or more compounds of formula I and one or more organic or inorganic acids like for example acetic acid, citric acid or HCl.

In another preferred embodiment of the present invention, the washing and the SAM treatment of the electrode are carried out in two separate process steps. For example, the electrode is washed with an acid, like e.g. acetic acid, and then the compounds of formula I, preferably dissolved in a suitable solvent, are applied to the washed electrode.

If the SAM treatment is applied to the electrode in a separate step (i.e. separately from the washing or other process steps), the concentration of the compounds of formula I in the formulation is preferably from 0.01% to 5% by weight. Preferably the solvent is selected from the group consisting of aliphatic ketones, like for example acetone or methyl butyl ketone (MBK), lower alkyl alcohols like ethanol and isopropylacohol (IPA), linear or cyclic ethers like THF, and other organic solvents dissolving the compounds of formula I.

The soaking time of the electrode with the formulation containing the compounds of formula I is preferably varying from 30s to 1 h. Optionally the SAM layer after deposition is annealed at elevated temperature, preferably from 30 to 150° C. The annealing time is preferably from 30s to 5 min, very preferably from 30s to 2 min.

If the washing and SAM treatment of the electrode are combined in a single step, the compounds of formula I are preferably dissolved in a diluted organic or inorganic acid like for example acetic acid, citric acid or HCl, for example 1% acetic acid, preferably in a concentration from 0.01% to 10% by weight. The soaking time of the electrode with the acid formulation containing the compound of formula I is preferably varying from 30s to 1 h. Optionally the SAM layer after deposition is annealed at elevated temperature, preferably from 30 to 150° C. The annealing time is preferably from 30s to 5 min, very preferably from 30s to 2 min.

Preferably the process according to the present invention comprises the following steps
a) depositing source and drain electrodes onto a substrate, or onto a gate insulator layer, for example by evaporation,
b) optionally washing the source and drain electrodes,
c) depositing a layer of a compound of formula I, or of a formulation comprising a compound of formula I and optionally one or more solvents, in the area between the source and drain electrodes, and optionally onto the surface of the source and drain electrodes, optionally removing any solvents present, and optionally annealing the layer of the compound of formula I,
d) depositing a layer of an organic semiconductor (OSC), or of a formulation comprising an OSC, onto the source and drain electrodes and onto the layer containing the compound of formula I, for example by spin coating or liquid printing, optionally removing the solvents still present, and optionally annealing the OSC layer,
wherein optionally steps b) and c) are combined into a single step.

Another preferred embodiment of the present invention relates to a process of preparing an OFET that comprises the following steps:
a) depositing source and drain electrodes onto a substrate,
b) optionally washing the source and drain electrodes,
c) depositing a layer of a compound of formula I, or of a formulation comprising a compound of formula I and optionally one or more solvents, in the area between the source and drain electrodes, and optionally onto the surface of the source and drain electrodes, optionally removing any solvents present, and optionally annealing the layer of the compound of formula I,
d) depositing a layer of an organic semiconductor (OSC), or of a formulation comprising an OSC, onto the source and drain electrodes and onto the layer containing the compound of formula I, optionally removing the solvents still present, and optionally annealing the OSC layer,
e) depositing a gate insulator layer onto the OSC layer,
f) depositing a gate electrode onto the gate insulator layer,
g) optionally depositing a passivation layer onto the gate electrode,
wherein optionally steps b) and c) are combined into a single step.

Steps b) and c) can be combined in one single step for example by applying a washing formulation to the source and drain electrodes that contains a compound of formula I, optionally removing the solvents still present, and optionally annealing the layer of the compound of formula I.

In the process according to the present invention as described in the general and preferred embodiments above and below, it is possible to use only one compound of formula I, or to use two or more compounds of formula I.

When preparing a top gate (TG) transistor, the source and drain electrodes are usually applied onto a substrate, as in step a) of the process described above, followed by steps b)-e). Then a gate insulator layer is applied onto the OSC layer, and a gate electrode is applied onto the gate insulator layer.

When preparing a bottom gate (BG) transistor, usually first a gate electrode is applied onto a substrate, a gate insulator layer is applied onto the gate electrode and the source and drain electrodes are then applied onto the gate insulator, as in step a) of the process described above, followed by steps b)-e).

The exact process conditions can be easily adopted and optimised to the corresponding insulator and OSC materials used.

The thickness of the layer containing the compounds of formula I provided on the electrode (after removal of solvents) in an electronic device according to the present invention is preferably from 1 to 10 molecular layers.

FIG. 1 is a schematic representation of a typical TG OFET according to the present invention, including source (S) and drain (D) electrodes (2) provided on a substrate (1), an SAM layer (3) of a compound of formula I provided on the S/D electrodes, a layer of OSC material (4) provided on the S/D electrodes and the SAM layer (3), a layer of dielectric material (5) as gate insulator layer provided on the OSC layer (4), a gate electrode (6) provided on the gate insulator layer (5), and an optional passivation or protection layer (7) provided on the gate electrode (6) to shield it from further layers or devices that may be later provided or protect it from environmental influence. The area between the source and drain electrodes (2), as indicated by the double arrow, is the channel area.

Figure 2:
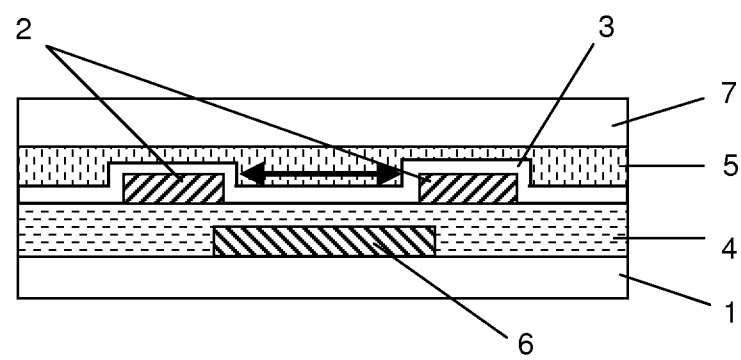
FIG. 2 schematically depicts a typical bottom gate OFET according to the present invention.

FIG. 2 is a schematic representation of a typical BG, bottom contact OFET according to the present invention, including a gate electrode (6) provided on a substrate (1), a layer of dielectric material (5) (gate insulator layer) provided on the gate electrode (4), source (S) and drain (D) electrodes (2) provided on the gate insulator layer (6), an SAM layer (3) of a compound of formula I provided on the S/D electrodes, a layer of OSC material (4) provided on the S/D electrodes and the SAM layer (3), and an optional protection or passivation layer (7) provided on the OSC layer (4) to shield it from further layers or devices that may be later provided or protect it from environmental influence.

The OSC materials and methods for applying the OSC layer can be selected from standard materials and methods known to the person skilled in the art, and are described in the literature.

The OSC material can be an n- or p-type OSC, which can be deposited by vacuum or vapor deposition, or preferably deposited from a solution. Preferably OSC materials are used which have a FET mobility of greater than $1 \times 10^{-5}$ $cm^2V^{-1}s^{-1}$.

The OSC is used for example as the active channel material in an OFET or a layer element of an organic rectifying diode. OSCs that are deposited by liquid coating to allow ambient processing are preferred. OSCs are preferably spray-, dip-, web- or spin-coated or deposited by any liquid coating technique. Ink-jet deposition is also suitable. The OSC may optionally be vacuum or vapor deposited.

The semiconducting channel may also be a composite of two or more of the same types of semiconductors. Furthermore, a p-type channel material may for example be mixed with n-type materials for the effect of doping the layer. Multilayer semiconductor layers may also be used. For example the semiconductor may be intrinsic near the insulator interface and a highly doped region can additionally be coated next to the intrinsic layer.

The OSC may be a monomeric compound (also referred to as "small molecule", as compared to a polymer or macromolecule) or a polymeric compound, or a mixture, dispersion or blend containing one or more compounds selected from either or both of monomeric and polymeric compounds.

In case of monomeric materials, the OSC is preferably a conjugated aromatic molecules, and contains preferably at least three aromatic rings. Preferred monomeric OSCs are selected form the group consisting of conjugated aromatic molecules containing 5-, 6- or 7-membered aromatic rings, more preferably containing 5- or 6-membered aromatic rings.

In these conjugated aromatic molecules, each of the aromatic rings optionally contains one or more hetero atoms selected from Se, Te, P, Si, B, As, N, O or S, preferably from N, O or S. Additionally or alternatively, in these conjugated aromatic molecules, each of the aromatic rings is optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N($R^3$)($R^4$), where $R^3$ and $R^4$ each independently is H, an optionally substituted alkyl group, or an optionally substituted aryl, alkoxy or polyalkoxy group. Where $R^3$ and $R^4$ is an alkyl or aryl group, these are optionally fluorinated.

In these conjugated aromatic molecules, the aromatic rings are optionally fused or are optionally linked to each other by a conjugated linking group such as —C($T^1$)=C($T^2$)-, —C≡C—, —N(R')—, —N=N—, (R')=N—, —N=C(R')—, wherein $T^1$ and $T^2$ each independently represent H, Cl, F, —C≡N or a $C_1$-$C_{10}$ alkyl group, preferably a $C_{1-4}$ alkyl group; R' represents H, an optionally substituted $C_1$-$C_{20}$ alkyl group or an optionally substituted $C_4$-$C_{30}$ aryl group. Where R' is an alkyl or aryl group, these are optionally fluorinated.

Further preferred OSC materials that can be used in this invention include compounds, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianapthene, poly (N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metalfree porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diary)-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or dialkynyl anthradithiophene; 2,2'-bibenzo[1,2-b:4,5-b]dithiophene. Preferred compounds are those from the above list and derivatives thereof which are soluble in organic solvents.

Especially preferred OSC materials are selected from the group consisting of polymers and copolymers comprising one or more repeating units selected from thiophene-2,5-diyl, 3-substituted thiophene-2,5-diyl, selenophene-2,5-diyl, 3-substituted selenophene-2,5-diyl, optionally substituted thieno[2,3-b]thiophene-2,5-diyl, optionally substituted thieno[3,2-b]thiophene-2,5-diyl, optionally substituted 2,2'-bithiophene-5,5'-diyl, optionally substituted 2,2'-biselenophene-5,5'-diyl.

Further preferred OSC materials are selected from the group consisting of substituted oligoacenes such as pentacene, tetracene or anthracene, or heterocyclic derivatives thereof, like 6,13-bis(trialkylsilylethynyl) pentacenes or 5,11-bis(trialkylsilylethynyl) anthradithiophenes, as disclosed for example in U.S. Pat. No. 6,690,029, WO 2005/055248 A1 or U.S. Pat. No. 7,385,221.

In another preferred embodiment of the present invention the OSC layer comprises one or more organic binders to adjust the rheological properties as described for example in WO 2005/055248 A1, in particular an organic binder which has a low permittivity, $\in$, at 1,000 Hz of 3.3 or less.

The binder is selected for example from poly(alpha-methylstyrene), polyvinylcinnamate, poly(4-vinylbiphenyl) or poly(4-methylstyrene, or blends thereof. The binder may also be a semiconducting binder selected for example from polyarylamines, polyfluorenes, polythiophenes, polyspirobifluorenes, substituted polyvinylenephenylenes, polycarbazoles or polystilbenes, or copolymers thereof. A preferred dielectric material (3) for use in the present invention preferably comprises a material with a low permittivity of between 1.5 and 3.3 at 1000 Hz, such as for example Cytop™809M commercially available from Asahi Glass.

The transistor device according to the present invention may also be a complementary organic TFT (CTFT) comprising both a p-type semiconducting channel and an n-type semiconducting channel.

The process according to the present invention is not limited to OFETs, but can be used in the manufacture of any OE device comprising a charge injection layer, like for example OLEDS or OPV devices. The skilled person can easily make modifications or changes to the process as described above and below, in order to use it for the manufacture of other OE devices.

For example, the process according to the present invention can also be applied to an electrode in an OPV device, like for example in a bulk heterojunction (BHJ) solar cell. The OPV device can be of any type known from the literature [see e.g. Waldauf et al., Appl. Phys. Lett. 89, 233517 (2006)].

A preferred OPV device according to the present invention comprises:
  a low work function electrode (for example a metal, such as aluminum), and a high work function electrode (for example ITO), one of which is transparent,
  a layer (also referred to as "active layer") comprising a hole transporting material and an electron transporting material, preferably selected from OSC materials, situated between the low work function electrode and the high work function electrode; the active layer can exist for example as a bilayer or two distinct layers or blend or mixture of p-type and n-type semiconductor, forming a bulk heterjunction (BHJ) (see for example Coakley, K. M. and McGehee, M. D. Chem. Mater. 2004, 16, 4533),
  an optional conducting polymer layer, for example comprising a blend of PEDOT:PSS (poly(3,4-ethylenedioxythiophene):poly(styrenesulfonate)), situated between the active layer and the high work function electrode, to modify the work function of the high work function electrode to provide an ohmic contact for holes,
  an optional coating (for example of LiF) on the side of the low workfunction electrode facing the active layer, to provide an ohmic contact for electrons,
wherein at least one of the electrodes, preferably the high work function electrode, is subjected to a process according to the present invention as described above and below.

Another preferred OPV device according to the present invention is an inverted OPV device that comprises:
  a low work function electrode (for example a metal, such as gold), and a high work function electrode (for example ITO), one of which is transparent,
  a layer (also referred to as "active layer") comprising a hole transporting material and an electron transporting material, preferably selected from OSC materials, situated between the low work function electrode and the high work function electrode; the active layer can exist for example as a bilayer or two distinct layers or blend or mixture of p-type and n-type semiconductor, forming a BHJ,
  an optional conducting polymer layer, for example comprising a blend of PEDOT:PSS, situated between the active layer and the low work function electrode to provide an ohmic contact for electrons,
  an optional coating (for example of $TiO_x$) on the side of the high workfunction electrode facing the active layer, to provide an ohmic contact for holes,
wherein at least one of the electrodes, preferably the high work function electrode, is subjected to a process according to the present invention as described above and below.

Thus, in the OPV devices of the present invention preferably at least one of the electrodes, preferably the high work function electrode, is covered, on its surface facing the active layer, by a layer comprising a compound of formula I or comprising a formulation comprising a compound of formula I. Said layer is advantageously applied by process according to the present invention as described above and below.

The OPV devices of the present invent invention typically comprise a p-type (electron donor) semiconductor and an n-type (electron acceptor) semiconductor. The p-type semiconductor is for example a polymer like poly(3-alkylthiophene) (P3AT), preferably poly(3-hexylthiophene) (P3HT), or alternatively another selected from the groups of preferred polymeric and monomeric OSC material as listed above. The n-type semiconductor can be an inorganic material such as zinc oxide or cadmium selenide, or an organic material such as a fullerene derivate, for example (6,6)-phenyl-butyric acid methyl ester derivatized methano $C_{60}$ fullerene, also known as "PCBM" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or an structural analogous compound with e.g. a $C_{70}$ fullerene group ($C_{70}$PCBM), or a polymer (see for example Coakley, K. M. and McGehee, M. D. *Chem. Mater.* 2004, 16, 4533).

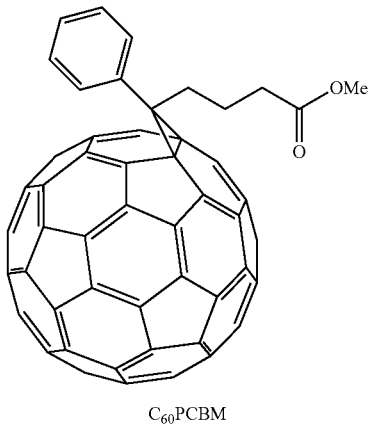 [SMILES: COC(=O)CCCC1(c2ccccc2)C23C=C4Cc5cc6cc7c8c9c(cc%10cc%11c%12c(c%13c%14c%15c(c4c5c4c6c8c(c%154)c4c9c%10c%12c%144)C%1321)C(=C3)C%11)C7]

$C_{60}$PCBM

A preferred material of this type is a blend or mixture of a polymer like P3HT or another polymer selected from the groups listed above, with a $C_{60}$ $C_{60}$ or $C_{70}$ fullerene or modified fullerene like PCBM. Preferably the ratio polymer:fullerene is from 2:1 to 1:2 by weight, more preferably from 1.2:1 to 1:1.2 by weight, most preferably 1:1 by weight. For the blended mixture, an optional annealing step may be necessary to optimize blend morpohology and consequently OPV device performance.

Preferably the deposition of individual functional layers in the process as described above and below, like the OSC layer and the insulator layer, is carried out using solution processing techniques. This can be done for example by applying a formulation, preferably a solution, comprising the OSC or dielectric material, respectively, and further comprising one or more organic solvents, onto the previously deposited layer, followed by evaporation of the solvent(s). Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating, or pad printing. Very preferred solution deposition techniques are spin coating, flexographic printing and inkjet printing.

In an OFET device according to the present invention, the dielectric material for the gate insulator layer is preferably an organic material. It is preferred that the dielectric layer is solution coated which allows ambient processing, but could be also deposited by various vacuum deposition techniques. When the dielectric is being patterned, it may perform the function of interlayer insulation or act as gate insulator for an OFET. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared. Optionally, the dielectric material could be cross-linked or cured to achieve better resitivity against solvents and/or structural integrity and/or to enable patternability (photolithography). Preferred gate insulators are those that provide a low permittivity interface to the organic semiconductor.

Suitable solvents are selected from solvents including but not limited to hydrocarbon solvents, aromatic solvents, cycloaliphatic cyclic ethers, cyclic ethers, acetated, esters, lactones, ketones, amides, cyclic carbonates or multi-component mixtures of the above. Examples of preferred solvents include cyclohexanone, mesitylene, xylene, 2-heptanone, toluene, tetrahydrofuran, MEK, MAK (2-heptanone), cyclohexanone, 4-methylanisole, butyl-phenyl ether and cyclohexylbenzene, very preferably MAK, butyl phenyl ether or cyclohexylbenzene.

The total concentration of the respective functional material (OSC or gate dielectric) in the formulation is preferably from 0.1 to 30 wt. %, preferably from 0.1 to 5 wt. %. In particular organic ketone solvents with a high boiling point are advantageous for use in solutions for inkjet and flexographic printing.

When spin coating is used as deposition method, the OSC or dielectric material is spun for example between 1000 and 2000 rpm for a period of for example 30 seconds to give a layer with a typical layer thickness between 0.5 and 1.5 µm. After spin coating the film can be heated at an elevated temperature to remove all residual volatile solvents.

For cross-linking, the cross-linkable dielectric material after deposition is preferably exposed to electron beam or electromagnetic (actinic) radiation, like for example X-ray, UV or visible radiation. For example, actinic radiation can used having a wavelength of from 50 nm to 700 nm, preferably from 200 to 450 nm, most preferably from 300 to 400 nm. Suitable radiation dosages are typically in the range from 25 to 3,000 mJ/cm². Suitable radiation sources include mercury, mercury/xenon, mercury/halogen and xenon lamps, argon or xenon laser sources, x-ray, or e-beam. The exposure to actinic radiation will induce a cross-linking reaction in the cross-linkable groups of the dielectric material in the exposed regions. It is also possible for example to use a light source having a wavelength outside the absorption band of the cross-linkable groups, and to add a radiation sensitive photosensitizer to the cross-linkable material.

Optionally the dielectric material layer is annealed after exposure to radiation, for example at a temperature from 70° C. to 130° C., for example for a period of from 1 to 30 minutes, preferably from 1 to 10 minutes. The annealing step at elevated temperature can be used to complete the cross-linking reaction that was induced by the exposure of the cross-linkable groups of the dielectric material to photoradiation.

All process steps described above and below can be carried out using known techniques and standard equipment which are described in prior art and are well-known to the skilled person. For example, in the photoirradiation step a commercially available UV lamp and photomask can be used, and the annealing step can be carried out in an oven or on a hot plate.

The thickness of a functional layer (OSC layer or dielectric layer) in an electronic device according to the present invention is preferably from 1 nm (in case of a monolayer) to 10 µm, very preferably from 1 nm to 1 µm, most preferably from 5 nm to 500 nm.

Various substrates may be used for the fabrication of organic electronic devices, for example silicon wafers, glass or plastics, plastics materials being preferred, examples including alkyd resins, allyl esters, benzocyclobutenes, butadiene-styrene, cellulose, cellulose acetate, epoxide, epoxy polymers, ethylene-chlorotrifluoro ethylene, ethylene-tetrafluoroethylene, fibre glass enhanced plastic, fluorocarbon polymers, hexafluoropropylenevinylidene-fluoride copolymer, high density polyethylene, parylene, polyamide, polyimide, polyaramid, polydimethylsiloxane, polyethersulphone, poly-ethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, and silicones.

Preferred substrate materials are polyethyleneterephthalate, polyimide, and polyethylenenaphthalate. The substrate may be any plastic material, metal or glass coated with the above materials. The substrate should preferably be homogeneous to ensure good pattern definition. The substrate may also be uniformly pre-aligned by extruding, stretching, rubbing or by photochemical techniques to induce the orientation of the organic semiconductor in order to enhance carrier mobility. Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

The following parameters are used:
$\mu_{LIN}$ is the linear charge carrier mobility
$\mu_{SAT}$ is the saturation charge carrier mobility
W is the length of the drain and source electrode (also known as "channel width")
L is the distance between the drain and source electrode (also known as "channel length")
$I_D$ is the source-drain current
$C_{OX}$ is the capacitance per unit area of the gate dielectric
$V_G$ is the gate voltage (in V)
$V_{DS}$ is the source-drain voltage
Sqrt(ID) is the linear charge carrier mobility Unless stated otherwise, all specific values of physical parameters like the permittivity ($\in$), charge carrier mobility ($\mu$), solubility parameter ($\delta$) and viscosity ($\eta$) as given above and below refer to a temperature of 20° C. (+/−1° C.).

Example 1

OTFT with Cu S/D Electrodes Subjected to a Two-Step SAM Treatment Process

A top gate OTFT device was prepared on glass as described below.
Substrate Cleaning:
A 1"×1" glass substrate (Corning XG2000) was placed into a substrates holder box and filled with methanol and sonicated in ultrasonic bath for 3 min at 25° C.

The substrate was spin-dried by placing it on to a spin coater and spinning for 20 s at 2000 rpm.
Source/Drain (S/D) Electrodes Preparation:
Cu S/D electrodes were prepared by thermal evaporation of Cu through a shadow mask using an Edwards 306 evaporator. The active channel dimensions were length/width 50 μm/1000 μm. The thickness of the electrodes was 40 nm and the evaporation rate was 0.1 nm/s.
Source/Drain Treatment:
A glass substrate with the Cu S/D electrodes was cleaned in 1% acetic acid by soaking for 5 min, then rinsed with water and spin-dried on the spincoater. Then a solution of 1% of compound of formula I11a (4,5,6,7-tetrafluoro-1H-benzotriazole, "F4BTA") dissolved in isopropyl alcohol (IPA) was applied by soaking the substrate for 1 min on the spincoater. After 1 min the formulation was spun-off, followed by spin-rinsing with IPA. Next the sample was spin-dried and annealed on a hot-plate for 1 min at 100° C.
OSC Coating:
The commercially available OSC formulation Lisicon S1200® (from Merck KGaA) was coated by spin-coating at 500 rpm/10s followed by 2000 rpm/60s, followed by an annealing step performed at 100° C. for 1 minute on a hot-plate.
Dielectric Coating:
Cytop® 807M polymer (from Asahi Glass) was used as the gate dielectric, spun-coated at 500 rpm/10s followed by 1700 rpm/30s, giving a layer thickness of 1.1 μm with a capacitance of 1.7 nF/cm².
Gate Electrode Preparation:
An Cu gate electrode was prepared by thermal evaporation of Cu through a shadow mask using an Edwards 306 evaporator. The thickness of electrode was 40 nm and the evaporation rate was 0.1 nm/s.
Transistor Characterisation:
Transistors were measured using Agilent 4155C Semiconductor Analyser connected to the probe station equipped with Karl Suss PH100 probe-heads. Transistors were measured as followed:
VD=−5V and VG was scanned from +20V to −60V and back in 1V steps
(Linear Mode)
VD=−60V and VG was scanned from +20V to −60V and back in 1V steps
(Saturation Mode)
Mobility values were calculated using the following formulas:
Linear Mode:

$$\mu_{LIN} = -\frac{L}{W*Cox*VD} * \frac{\partial ID}{\partial VG}$$

Saturation Mode:

$$\mu_{SAT} = \frac{2L}{W*Cox} * \left(\frac{\partial sqrtID}{\partial VG}\right)^2$$

Figure 3:
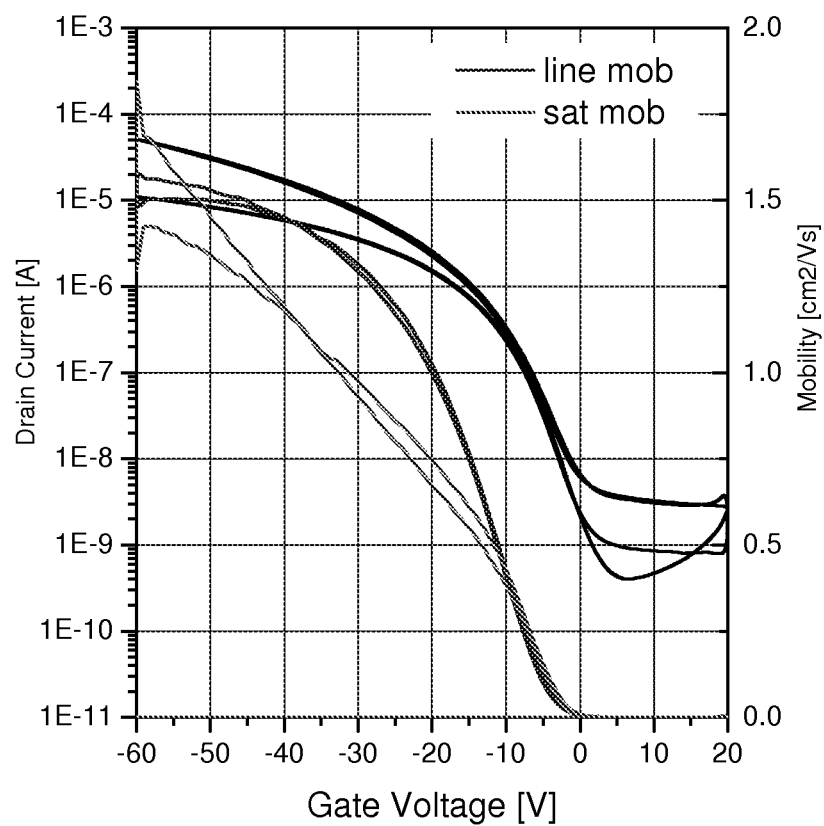
FIG. 3 shows the transfer characteristics of an OFET prepared in accordance with the process described in Example 1.

FIG. 3 shows the transfer characteristics of the transistor obtained according to the process as described above. It can be seen that the treatment with 4FBTA applied to the copper electrodes enables charge carrier injection, and that the transistor shows the typical characteristics for a S1200 Lisicon formulation.

The values for the linear mobility $\mu_{LIN}$, saturated mobility $\mu_{SAT}$, and on-off ratio are given below:
Linear mobility: 1.55 cm²/Vs, saturation mobility: 1.45 cm²/Vs and on-off ratio: 10⁴

Example 2

OTFT with Cu S/D Electrodes Subjected to a Single Step SAM Treatment Process

A top gate OTFT device was prepared on glass and characterised as described in Example 1, except that the step "source/drain treatment" was carried out in a single step procedure as described below.
Source/Drain Treatment:
The glass substrate with Cu electrodes was treated with a formulation containing a 1% acetic acid mixed with 1% of compound of formula I11a (F4BTA) at 1:1 ratio by volume for 1 min. Then the substrate was washed with water and IPA and spin-dried on the spincoater.

Figure 4:
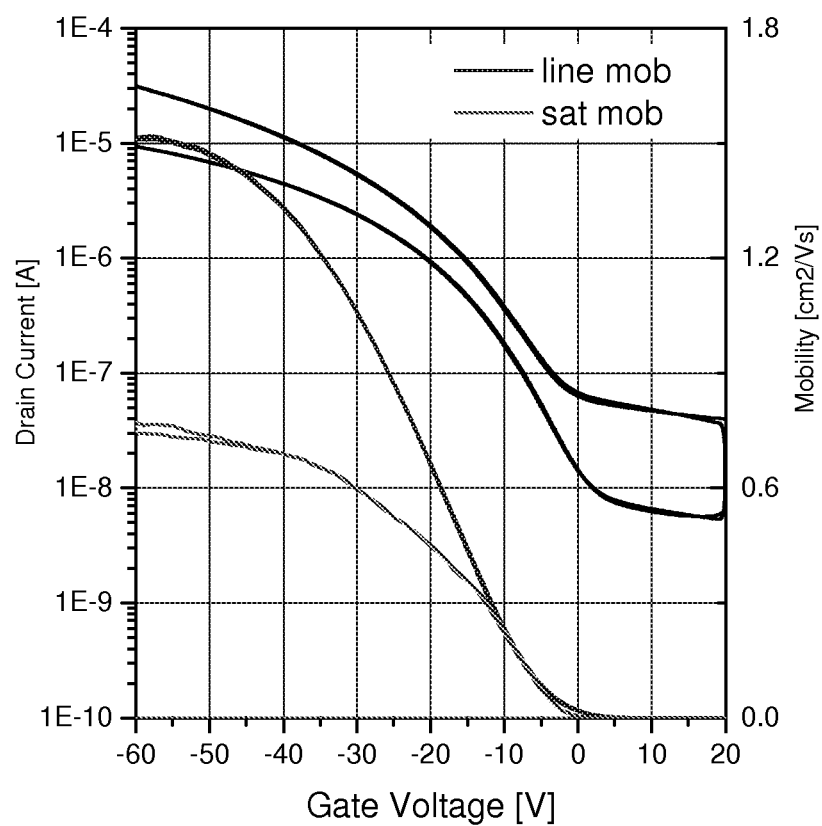
FIG. 4 shows the transfer characteristics of an OFET prepared in accordance with the process described in Example 2.

FIG. 4 shows the transfer characteristics of the transistor obtained by the process according to Example 2. It can be seen that single-step treatment applied to the copper electrodes also enabled the charge carrier injection and transistor shows typical characteristics for S1200 Lisicon® formulation.

The values for the linear mobility $\mu_{LIN}$, saturated mobility $\mu_{SAT}$, and on-off ratio are given below:
Linear mobility: 1.5 cm²/s, saturation mobility: 0.75 cm²/Vs and on-off ratio: 10³

Example 3

OTFT with Cu S/D Electrodes Subjected to a Two-Step SAM Treatment Process

A top gate OTFT device was prepared on glass and characterised as described in Example 1, except that the step "source/drain treatment" was carried out as described below.
Source/Drain Treatment:
A glass substrate with the Cu S/D electrodes was cleaned in 1% acetic acid by soaking for 5 min, then rinsed with water and spin-dried on the spincoater. Then a solution of 0.2% of compound of formula I15f wherein R$^f$ is CF₃ and R$^x$ is NH₂ (5-(trifluoromethyl)-1H-indazol-3-amine) dissolved in isopropyl alcohol (IPA) was applied by soaking the substrate for 1 min on the spincoater. After 1 min the formulation was spun-off, followed by spin-rinsing with IPA. Next the sample was spin-dried and annealed on a hot-plate for 1 min at 100° C.

Figure 5:
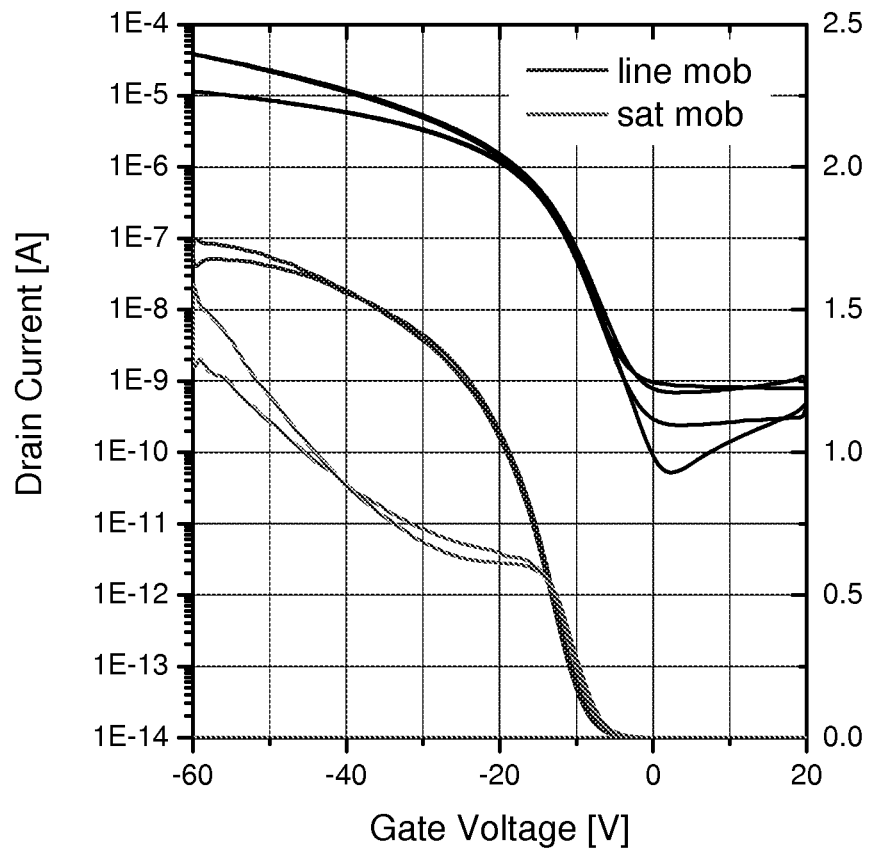
FIG. 5 shows the transfer characteristics of an OFET prepared in accordance with the process described in Example 3.

FIG. 5 shows the transfer characteristics of the transistor obtained by the process according to Example 3. It can be seen that the treatment with 5-(trifluoromethyl)-1H-indazol-3-amine applied to the copper electrodes enables charge carrier injection, and that the transistor shows the typical characteristics for a S1200 Lisicon® formulation.

The values for the linear mobility $\mu_{LIN}$, saturated mobility $\mu_{SAT}$, and on-off ratio are given below:
Linear mobility: 1.7 cm²/s, saturation mobility: 1.25 cm²/Vs and on-off ratio: 10⁴

Comparison Example 1

OTFT with Cu S/D Electrodes without SAM Treatment Process

A top gate OTFT device was prepared on glass and characterised as described in Example 1, except that the step "source/drain treatment" was carried out as described below.

Source/Drain Treatment:
The glass substrate with Cu electrodes was cleaned in 1% acetic acid by soaking for 5 min, then rinsed with water and spin-dried on the spincoater.

Figure 6:
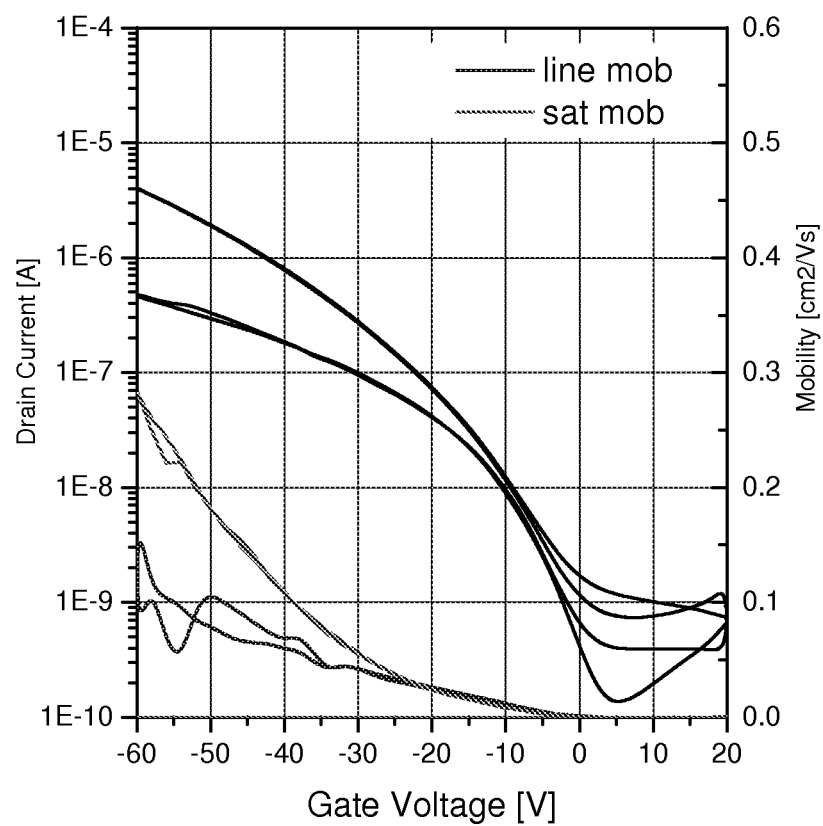
FIG. 6 shows the transfer characteristics of an OFET prepared in accordance with the process described in Comparison Example 1.

FIG. 6 shows the transfer characteristics of the transistor obtained by the process according to Comparison Example 1. It can be seen that the transistor shows poor performance with a low value of the on-current, which is not typical for a S1200 Lisicon® formulation. This indicates that untreated copper electrodes do not inject charge carriers efficiently into the OSC layer.

The values for the linear mobility $\mu_{LIN}$, saturated mobility $\mu_{SAT}$, and on-off ratio are given below:
Linear mobility: 0.28 cm²/s, saturation mobility: 0.1 cm²/Vs and on-off ratio: 10³

The invention claimed is:
1. A process comprising
providing in an electronic device one or more electrodes containing a metal or metal oxide, and
depositing onto the surface of said electrodes a layer comprising a compound of formula I, and
depositing onto the surface of said electrodes which is covered by said layer comprising the compound of formula I, or depositing in the area between two or more of said electrodes, an organic semiconductor,

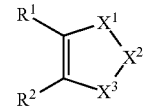

I wherein
X¹, X², X³ are independently of each other selected from —N(H)—, —N═, ═N—, —C(R$^x$)═, ═C(R$^x$)— and —S—, wherein at least one of X¹, X² and X³ is different from —C(R$^x$)═ and ═C(R$^x$)—,
R$^x$ is on each occurrence identically or differently H, NH₂, or straight-chain or branched alkyl with 1 to 15 C atoms, in which one or more non-adjacent C atoms are optionally replaced by —O—, —NR°—, —CO—, —CO—O—, —O—CO—, —O—CO—O—, —CR°═CR°°— or —C≡C— and in which one or more H atoms are optionally replaced by F, Cl, Br, I or CN,
R¹ and R² are independently of each other F, Cl, P-Sp-, or straight-chain or branched alkyl with 1 to 15 C atoms, in which one or more non-adjacent C atoms are optionally replaced by —O—, —NR°—, —CO—, —CO—O—, —O—CO—, —O—CO—O—, —CR°═CR°°— or —C≡C— and in which one or more H atoms are optionally replaced by F, Cl, Br, I or CN, or denote aryl, heteroaryl, aryloxy, heteroaryloxy, arylcarbonyl, heteroarylcarbonyl, arylcarbonyloxy, heteroarylcarbonyloxy, aryloxycarbonyl or heteroaryloxycarbonyl having 2 to 30 C atoms that is unsubstituted or substituted by one or more non-aromatic groups R, or R¹ and R², together with each other and with the 5-membered heterocycle to which they are attached, form an aromatic or heteroaromatic ring that comprises 5 to 7 ring atoms and is unsubstituted or substituted by 1, 2, 3, 4 or 5 groups R,
R° and R°° are independently of each other H or optionally substituted carbyl or hydrocarbyl optionally comprising one or more hetero atoms,
R is on each occurrence identically or differently H, P-Sp-, halogen, —CN, —NC, —NCO, —NCS, —OCN, —SCN, —C(=O)NR⁰R⁰⁰, —C(=O)X⁰, —C(=O)R⁰,
—NH₂, —NR⁰R⁰⁰, —SR⁰, —SO₃H, —SO₂R⁰, —OH,
—NO₂, —CF₃, —SF₅, optionally substituted silyl, carbyl or hydrocarbyl with 1 to 40 C atoms that is optionally substituted and optionally comprises one or more hetero atoms, P is a polymerizable or crosslinkable group, Sp is a spacer group or a single bond, and X⁰ is halogen.

2. The process of claim 1, wherein in the compound of formula I, R¹ and R², together with each other and with the 5-membered heterocycle to which they are attached, form a benzene ring wherein one or two CH groups are optionally replaced by N, and wherein said ring is unsubstituted or substituted by 1, 2, 3 or 4 groups R.

3. The process of claim 1, wherein in the compound of formula I, R¹ and R², together with each other and with the 5-membered heterocycle to which they are attached, form a benzene, pyridine or pyrimidine ring which is unsubstituted or substituted by 1, 2, 3 or 4 non-aromatic groups R.

4. The process of claim 1, wherein the compound of formula I is selected from formula I1

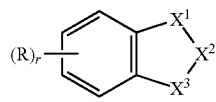
I1 wherein

X¹ is —N(H)—, —C(Rˣ)=, or —S—,

X² is —N=, —N(H)—, —C(Rˣ)= or —S—,

X³ is —N= or —N(H)—, r is 0, 1, 2, 3 or 4, and

Rˣ and R have the meanings given for the compound of formula I.

5. The process of claim 4, wherein the compound of formula I is selected from the following formulae:

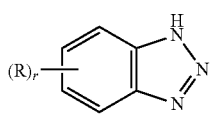
I11

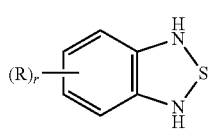
I12

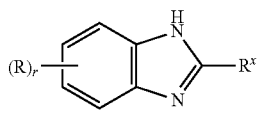
I13

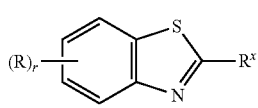
I14

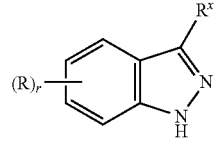
I15 wherein Rˣ, R and r are as defined for the compound of formula I1.

6. The process of claim 1, wherein in formula I, Rˣ is H or NH₂, and R denotes, on each occurrence identically or differently, F or C₁-C₁₅ perfluoroalkyl.

7. The process of claim 1, wherein in formula I, at least one group Rˣ or R denotes P-Sp-, wherein P and Sp are as defined for the compound of formula I.

8. The process of claim 5, wherein the compound of formula I is selected of the following formulae

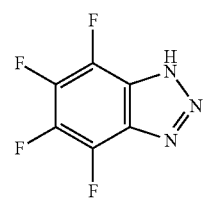
I11a

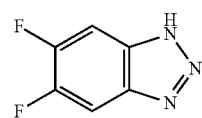
I11b

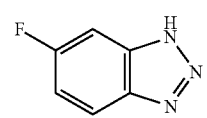
I11c

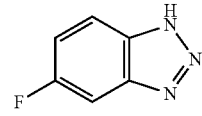
I11d

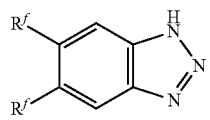
I11e

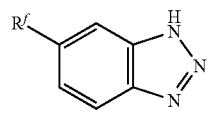
I11f

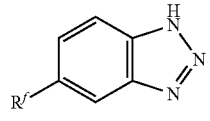
I11g

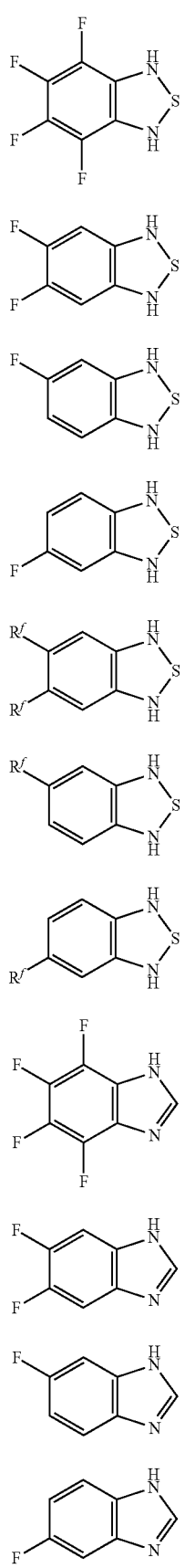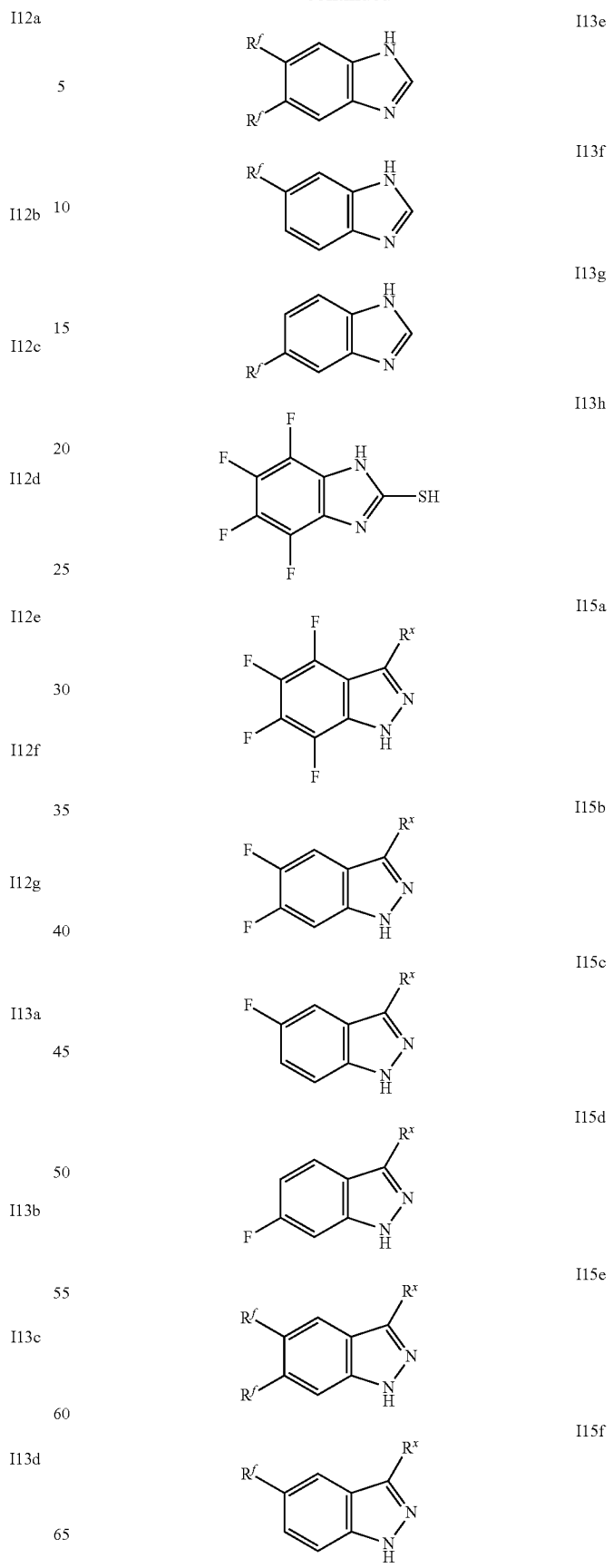

-continued

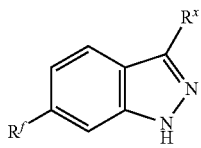

I15g wherein $R^f$ is straight chain or branched perfluoroalkyl having 1 to 15 C atoms, and $R^x$ is as defined for the compound of I11 to I15.

9. The process of claim 1, comprising:
a) depositing source and drain electrodes onto a substrate, or onto a gate insulator layer,
b) optionally washing the source and drain electrodes,
c) depositing a layer of a compound of formula I, or of a formulation comprising a compound of formula I and optionally one or more solvents, in the area between the source and drain electrodes, and optionally onto the surface of the source and drain electrodes, optionally removing any solvents present, and optionally annealing the layer of the compound of formula I, and
d) depositing a layer of an organic semiconductor (OSC), or of a formulation comprising an OSC, onto the source and drain electrodes and onto the layer containing the compound of formula I, optionally removing the solvents still present, and optionally annealing the OSC layer,
wherein optionally steps b) and c) are combined in a single step.

10. The process of claim 1, comprising:
a) depositing source and drain electrodes onto a substrate,
b) optionally washing the source and drain electrodes,
c) depositing a layer of a compound of formula I, or of a formulation comprising a compound of formula I and optionally one or more solvents, in the area between the source and drain electrodes, and optionally onto the surface of the source and drain electrodes, optionally removing any solvents present, and optionally annealing the layer of the compound of formula I,
d) depositing a layer of an organic semiconductor (OSC), or of a formulation comprising an OSC, onto the source and drain electrodes and onto the layer containing the compound of formula I, optionally removing the solvents still present, and optionally annealing the OSC layer,
e) depositing a gate insulator layer onto the OSC layer,
f) depositing a gate electrode onto the gate insulator layer, and
g) optionally depositing a passivation layer onto the gate electrode, wherein optionally steps b) and c) are combined in a single step.

11. An organic electronic device obtained by a process of claim 1.

12. An organic electronic device of claim 11, wherein the device is selected from the group consisting of organic field effect transistors (OFET), organic thin film transistors (OTFT), components of integrated circuitry (IC), radio frequency identification (RFID) tags, organic light emitting diodes (OLED), electroluminescent displays, flat panel displays, backlights, photodetectors, sensors, logic circuits, memory elements, capacitors, organic photovoltaic (OPV) cells, charge injection layers, Schottky diodes, planarising layers, antistatic films, conducting substrates or patterns, photoconductors, photoreceptors, electrophotographic devices and xerographic devices.

13. An electronic device of claim 11, wherein the device is a top gate or bottom gate OFET.

14. The process of claim 5, wherein in formulae I1 and I11-I15, $R^x$ is H or $NH_2$, and R denotes, on each occurrence identically or differently, F or $C_1$-$C_{15}$ perfluoroalkyl.

15. The process of claim 5, wherein in formulae I1 and I11-I15, at least one group $R^x$ or R denotes P-Sp-, wherein P and Sp are as defined for the compound of formula I.

* * * * *